US012646556B2

(12) United States Patent
Tringali

(10) Patent No.: US 12,646,556 B2
(45) Date of Patent: Jun. 2, 2026

(54) LOW OVERHEAD REFRESH MANAGEMENT OF A MEMORY DEVICE

(71) Applicant: Rambus Inc., San Jose, CA (US)

(72) Inventor: J. James Tringali, Los Altos, CA (US)

(73) Assignee: Rambus Inc., San Jose, CA (US)

( * ) Notice: Subject to any disclaimer, the term of this patent is extended or adjusted under 35 U.S.C. 154(b) by 94 days.

(21) Appl. No.: 18/716,098

(22) PCT Filed: Dec. 2, 2022

(86) PCT No.: PCT/IB2022/061737
§ 371 (c)(1),
(2) Date: Jun. 3, 2024

(87) PCT Pub. No.: WO2023/105376
PCT Pub. Date: Jun. 15, 2023

(65) Prior Publication Data
US 2025/0029649 A1      Jan. 23, 2025

Related U.S. Application Data

(60) Provisional application No. 63/286,439, filed on Dec. 6, 2021.

(51) Int. Cl.
*G11C 11/406*      (2006.01)
*G11C 11/4078*      (2006.01)
(52) U.S. Cl.
CPC .... *G11C 11/4078* (2013.01); *G11C 11/40603* (2013.01)

(58) Field of Classification Search
CPC .............. G11C 11/406; G11C 11/4078; G11C 11/40643
See application file for complete search history.

(56) References Cited

U.S. PATENT DOCUMENTS

| | | | |
|---|---|---|---|
| 5,583,823 A | 12/1996 | Park | |
| 9,058,896 B2 | 6/2015 | Franceschini et al. | |
| 10,892,001 B2 | 1/2021 | Ware et al. | |
| 2014/0006703 A1 | 1/2014 | Bains et al. | |
| 2014/0047306 A1 | 2/2014 | Perego | |
| 2014/0095780 A1* | 4/2014 | Bains ................... | G11C 11/406 711/105 |

(Continued)

OTHER PUBLICATIONS

JEDEC Solid State Technology Association, "JEDEC Standard, DDR5 SDRAM, JESD79-5", Jul. 2020, Downloaded at www.jedec. org. 496 pages.

(Continued)

*Primary Examiner* — Woo H Choi
(74) *Attorney, Agent, or Firm* — Womble Bond Dickinson (US) LLP

(57)      ABSTRACT
A system and method for performing a low overhead refresh management of a memory device. The method includes receiving, by a controller from a dynamic random access memory (DRAM) device via a feedback interface, a signal indicative of an occurrence of a row hammer event. The method includes determining, by the controller based on the signal, whether to schedule a refresh event. The method includes sending, by the controller responsive to determining whether to schedule the refresh event, a first command to the DRAM device to execute a refresh operation.

17 Claims, 4 Drawing Sheets

400 receiving, by a controller from a memory via a feedback interface, a signal indicative of an occurrence of a row hammer event
402 determining, by the controller based on the signal, whether to schedule a refresh event
404 sending, by the controller responsive to determining whether to schedule the refresh event, a first command to the memory to execute a refresh operation
406

(56) References Cited

U.S. PATENT DOCUMENTS

2019/0096472  A1*  3/2019  Kang ............... G11C 11/40615
2021/0264999  A1    8/2021  Bains et al.

OTHER PUBLICATIONS

Notification of Transmittal of the International Search Report and
the Written Opinion of the International Searching Authority, or the
Declaration with Mail Date Apr. 5, 2023 re: Int'l Appln. No.
PCT/IB2022/061737. 13 pages.

* cited by examiner

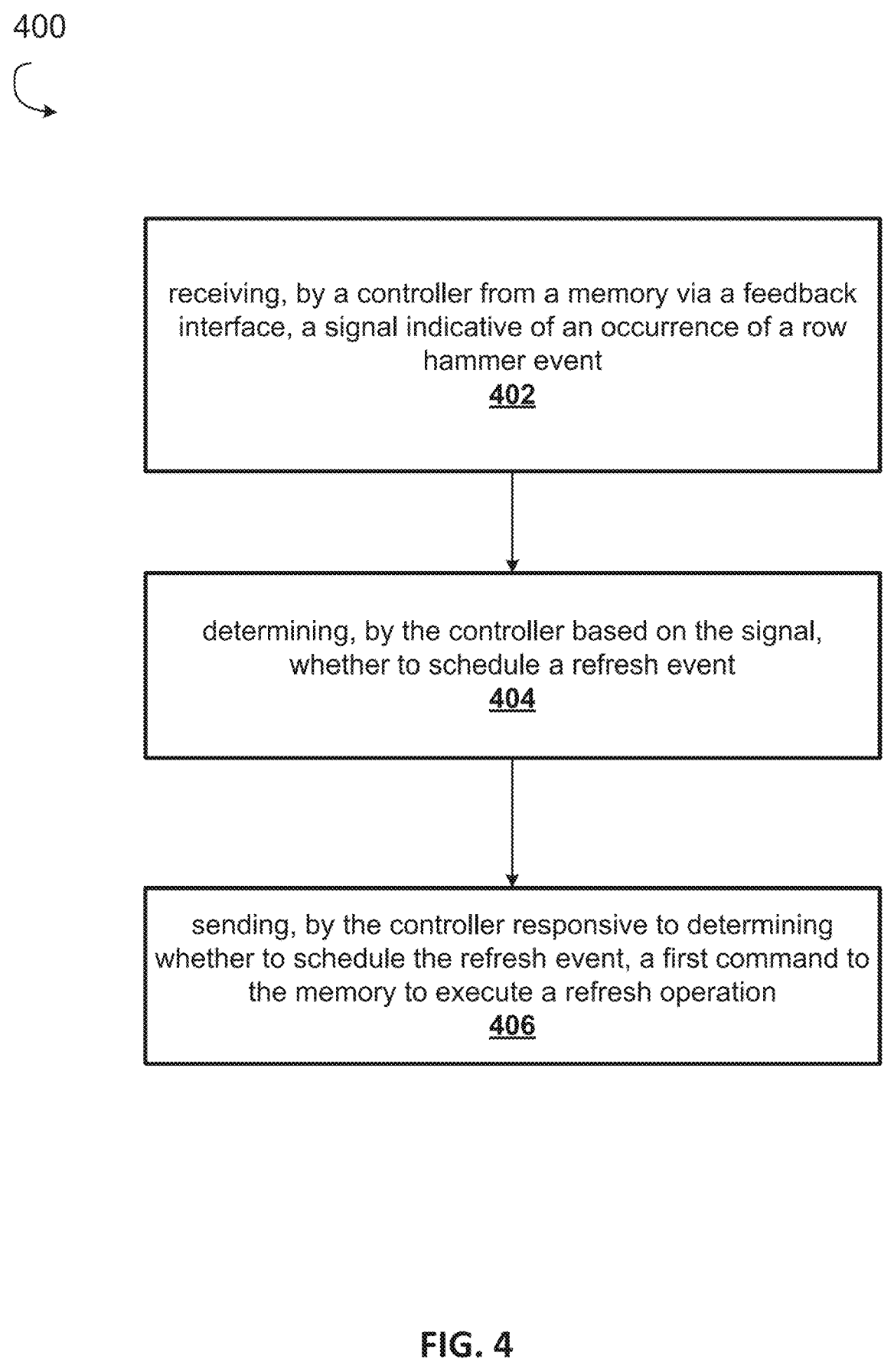

400 receiving, by a controller from a memory via a feedback interface, a signal indicative of an occurrence of a row hammer event
402 determining, by the controller based on the signal, whether to schedule a refresh event
404 sending, by the controller responsive to determining whether to schedule the refresh event, a first command to the memory to execute a refresh operation
406

FIG. 4

LOW OVERHEAD REFRESH MANAGEMENT OF A MEMORY DEVICE

REFERENCES TO RELATED APPLICATION

This application is a national stage application filed under 35 U.S.C. 371 based on International Patent Application No. PCT/IB2022/061737, filed Dec. 2, 2022, which is related to, and claims the benefit of priority of, U.S. Provisional Application No. 63/286,439 filed 6 Dec. 2021, titled "LOW OVERHEAD REFRESH MANAGEMENT OF A MEMORY DEVICE", the entire contents of which are hereby incorporated by reference herein.

BACKGROUND

Technical Field

The present disclosure relates generally to integrated circuit memory devices, controller devices, and memory systems. More specifically, the present disclosure relates to systems and methods for performing a low overhead refresh management of a memory device.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

FIG. 4 is a flow diagram depicting a method for performing a low overhead refresh management of the dynamic random access memory device (DRAM) in FIG. 1, according to some embodiments.

DETAILED DESCRIPTION

As discussed in greater detail below, the embodiments of the present disclosure relate to refreshment management (RFM) determination and tracking (e.g., using sideband traffic routed onto a sideband interface) of a Dynamic Random-Access Memory (DRAM) and a memory controller. This allows the DRAM row hammer techniques to remain opaque and maximize the ability of the memory controller to schedule the extra refreshes accurately and efficiently. The present disclosure also defines a protocol that encapsulates the scheduling of a refresh event (e.g., RFM commands) along with the bank and/or the row of the memory cells to immediately target for RFM. In addition, the protocol definition is flexible enough to signal legacy information currently being transmitted on the sideband interface (e.g., reliability and serviceability (RAS) cyclic redundancy check (CRC) check status on DRAM command-address (CA) bus) using an encoding/decoding mechanism. This feature also maintains backward compatibility by providing an externally visible DRAM mode register (MR) enable bit to enable or disable the overloading of the sideband interface with row hammer information.

Thus, the embodiments of the present disclosure perform a low overhead refresh management of the DRAM based on a feedback signal that is indicative of an actual (as opposed to an approximate) occurrence of a row hammer event. Benefits of using the one or more embodiments of the present disclosure may include a reduction in the data latency on the command interface and/or the data interface of the DRAM, as well as, an improvement in the bandwidth of the DRAM because fewer refreshes (and pausing of data transmissions) are needed in order to achieve optimal performance of the DRAM.

Memory Controller and Memory Device

Figure 1:
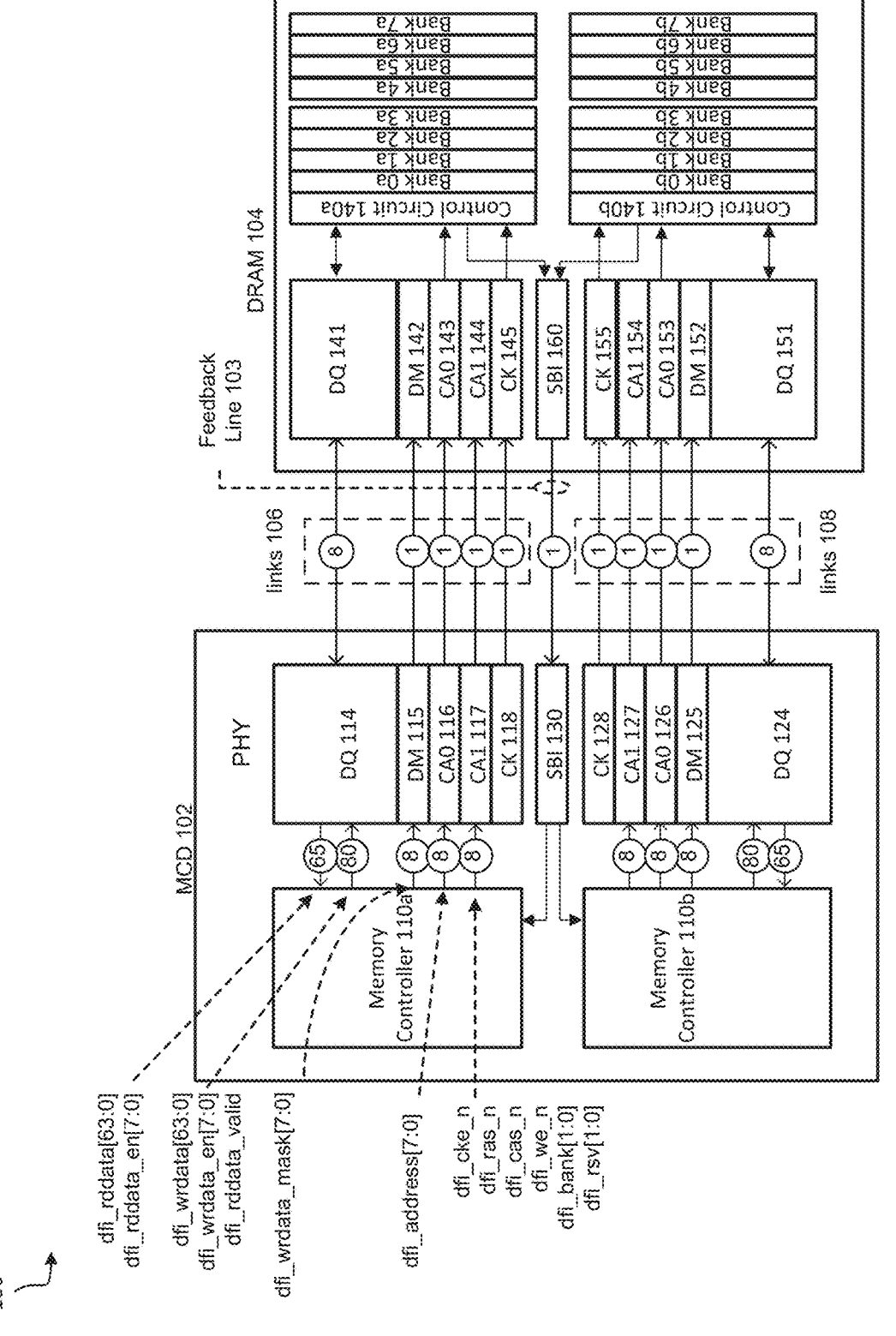
FIG. 1 illustrates a block diagram of an example memory system, according to some embodiments.

FIG. 1 illustrates a block diagram of an example memory system, according to some embodiments. The memory system 100 includes a memory controller device (MCD) 102 and a synchronous type dynamic random access memory device (DRAM) 104 according to an example embodiment. In some embodiments, the MCD 102 may be a stand-alone chip (e.g., an integrated circuit (IC)) that is separate from the DRAM 104, or the MCD 102 and the DRAM 104 may be disposed in the same package. The MCD 102 includes two sets of memory controllers, namely memory controller 110a and memory controller 110b (collectively referred to as, "memory controllers 110").

Each of the memory controllers 110 include refresh-control circuitry that is configured to perform refresh management (RFM) for the DRAM 104 by scheduling a refresh (sometimes referred to as, "refresh events") of the DRAM 104 and sending refresh commands to the DRAM 104 to cause the DRAM 104 perform the scheduled refresh of the DRAM 104.

The DRAM 104 includes two or more sets of memory banks, where each memory bank includes one or more memory cells. Each of the memory cells are configured to store a bit of data having a value of '0' or '1'. The first set of memory banks includes Bank 0a, Bank 1a, Bank 2a, Bank 3a, Bank 4a, Bank 5a, Bank 6a, and Bank 7a (collectively referred to as, "Banks 0a-7a"). The second set of memory banks includes Bank 0b, Bank 1b, Bank 2b, Bank 3b, Bank 4b, Bank 5b, Bank 6b, and Bank 7b (collectively referred to as, "Banks 0b-7b").

The DRAM 104 includes a control circuit 140a that is respectively coupled to Banks 0a-7a and a control circuit 140b that is respectively coupled to Banks 0b-7b. The control circuit 140a may be configured to receive a refresh command from the memory controller 110a and to perform a refresh of one or more cells of Banks 0a-7a according to the refresh command. The control circuit 140b may be configured to receive a refresh command from the memory controller 110b and to perform a refresh of one or more cells of Banks 0b-7b according to the refresh command.

Each of the memory controllers 110 may be configured to communicate with the memory banks on DRAM 104 through a number of interfaces and communications links. More specifically, communications take place between memory controller 110a and the first set of memory banks (e.g., Banks 0a-7a) on DRAM 304 through (1) interfaces DQ 114, DM 115, CA0 116, CA1 117 and CK 118 on MCD 102, (2) links 106, and (3) interfaces DQ 141, DM 142, CA0 143, CA1 144, and CK 145 on DRAM 104. Similarly, communications take place between memory controller 110b and the second set of memory banks (e.g., Banks 0b-7b) on DRAM 104 through (1) interfaces DQ 124, DM 125, CA0

126, CA1 127 and CK 128 on MCD 102, (2) links 108, and (3) interfaces DQ 151, DM 152, CA0 153, CA1 154, and CK 155 on DRAM 104.

The memory controller 110a may send one or more commands (e.g., read, write, refresh, etc.) to the first set of memory banks (e.g., Banks 0a-7a) and/or the control circuit 140a through CA0 116 and CA 117 (sometimes collectively referred to as, "a command interface" of MCD 102), links 106, and CA0 143 and CA1 144 (sometimes collectively referred to as, "a command interface" of DRAM 104).

The memory controller 110b may send one or more commands to the second set of memory banks (e.g., Banks 0b-7b) and/or the control circuit 140b through CA0 126 and CA 127 (sometimes collectively referred to as, "a command interface" of MCD 102), links 108, and CA0 153 and CA1 154 (sometimes collectively referred to as, "a command interface" of DRAM 104).

The memory controller 110a may send/receive one or more sets of data to/from the first set of memory banks (e.g., Banks 0a-7a) and/or the control circuit 140a through DQ 114 (sometimes collectively referred to as, "a data interface" of MCD 102), links 106, and DQ 141 (sometimes collectively referred to as, "a data interface" of DRAM 104).

The memory controller 110b may send/receive one or more sets of data to/from the first set of memory banks (e.g., Banks 0b-7b) and/or the control circuit 150 through DQ 124 (sometimes collectively referred to as, "a data interface" of MCD 102), links 108, and DQ 151 (sometimes collectively referred to as, "a data interface" of DRAM 104).

The MCD 102 includes a sideband interface (SBI) 130 and the DRAM 104 includes an SBI 160 for communicating signals across a feedback line 103 (e.g., a channel, a path), where the signals are indicative of row hammer events associated with the first set of memory banks (e.g., Banks 0a-7a) and/or the second set of memory banks (e.g., Banks 0b-7b).

In some embodiments, signals sent through SBI 130 may be asynchronous or synchronous to signals sent through the data interface and/or the command interface of the MCD 102. In some embodiments, signals sent through SBI 160 may be asynchronous or synchronous to signals sent through the data interface and/or the command interface of the DRAM 104. In some embodiments, SBI 160 may be a single output pin and SBI 130 may be a single input pin. In some embodiments, SBI 160 may correspond to a register ALERT output signal pin and SBI 130 may correspond to a register ALERT input signal pin.

Memory Refresh Management

The memory system 100 in FIG. 1 is configured to perform a low overhead refresh management procedure, where the MCD 102 accurately detects the actual occurrence of row hammer attacks on the DRAM 104 based on a feedback signal that is provided by the DRAM 104 to the MCD 102 through the sideband interfaces (e.g., SBI 130, SBI 160), instead of approximating the occurrence of row hammer attacks based on DRAM activation counts and an elapse of a timer. The operations of the low overhead refresh management procedure are described in more detail below.

In some embodiments, each of the memory controllers 110 may be configured to receive a signal from the DRAM 104 through SBI 130, where the signal is indicative of an actual occurrence of a row hammer event on the first set of memory banks (e.g., Banks 0a-7a) or the second set of memory banks (e.g., Banks 0b-7b). In some embodiments, each of the memory controllers 110 may be configured to receive the signal from the DRAM 104 without previously sending a request to the DRAM 104 for the signal.

In some embodiments, the signal may include a refresh management (RFM) packet. In some embodiments, the RFM packet may include a payload and at least one of a preamble or a cyclic redundancy check (CRC) value. In some embodiments, the payload of the RFM packet may include information indicative of an actual occurrence of a row hammer event, such as a row identifier (e.g., the specific row under attack), a bank identifier (e.g., the specific memory bank under attack), and/or a rank identifier (e.g., the specific memory rank under attack). In some embodiments, the payload of the RFM packet may include information indicative of the actual occurrence of a row hammer event, a communication error associated with the DRAM 104, a malicious attack on the DRAM 104 that is unrelated to the row hammer event, and/or a reliability and serviceability (RAS) error. In some embodiments, a RAS error may be a command address (CA) interface error associated with the command interface of the DRAM 104 or the MCD 102.

In some embodiments, each of the memory controllers 110 may be configured to determine an error associated with the RFM packet based on the CRC value, and in response, send, to the DRAM 104, a request for the DRAM 104 to resend the RFM payload. The request causes the DRAM 104 to resend the RFM payload to each of the memory controllers 110 in a second RFM packet through SBI 160, the links 106, and SBI 130.

In some embodiment, each of the control circuits 140 may be configured to monitor, responsive to sending a signal through SBI 160 and SBI 160 to determine whether the signal has become corrupted when traveling across SBI 160 and SBI 130. If a control circuit 140 determines that the signal has become corrupted, then the control circuit 140 may resend the signal through SBI 160.

In some embodiments, each of the memory controllers 110 may be configured to determine whether the signal is associated with the first set of memory banks (e.g., Banks 0a-7a) and/or the control circuit 140a, or whether the signal is associated with the second set of memory banks (e.g., Banks 0b-7b) and/or the control circuit 140b. In response to determining that the signal is associated with the first set of memory banks (e.g., Banks 0a-7a), the memory controller 110a may determine to refresh the first set of memory banks (e.g., Banks 0a-7a). In response to determining that the signal is associated with the second set of memory banks (e.g., Banks 0b-ba), the memory controller 110b may determine to refresh the second set of memory banks (e.g., Banks 0b-7b).

In some embodiments, each of the memory controllers 110 may be configured to determine, based on mode information, whether to refresh its respective set of memory banks (e.g., Banks 0a-7a or Banks 0b-7b) based on a first mode or a second mode. In some embodiments, each of the memory controllers 110 may be configured to retrieve the mode information from the DRAM 104 by reading the mode information from an address of the first set of memory banks (e.g., Banks 0a-7a) or the second set of memory banks (e.g., Banks 0b-7b) through the data interface and/or command interface of the MCD 102. In some embodiments, each of the memory controllers 110 may be configured to determine whether the DRAM 104 is configured in a first mode or a second mode based on the mode information. In some embodiments, the DRAM 104 may be configured to send the mode information to the MCD 102 upon the occurrence of a trigger event, such as upon power-up of the DRAM 104, upon a change to the mode information, and/or periodically (e.g., every n seconds, every n minutes, every n hours, etc.).

If a memory controller 110 determines that DRAM 104 is configured in a first mode, then the memory controller 110 may determine, based on the signal received through SBI 130, whether to schedule a refresh event for its respective set of memory banks (e.g., Banks 0a-7a or Banks 0b-7b). Since the signal received through SBI 130 is indicative of an actual occurrence of a row hammer event, the memory controller 110 is effectively making its determination to schedule the refresh event without ever (1) monitoring, directly or indirectly, an activity (e.g., read and/or writes) of the memory banks and/or (2) monitoring a timer associated with a predetermined threshold value of the memory banks. In other words, even if the DRAM 104 sends a predetermined threshold value (e.g., RAA Initial Management Threshold (RAAIMT)) to the memory controller 110 through the command interface or the data interface, the memory controller 110 schedules the refresh event without ever considering the predetermined threshold value.

If the memory controller 110 determines to schedule the refresh event for its respective memory bank according to the first mode, then the memory controller 110 may send a refresh command (sometimes referred to as, "first command") to its respective control circuit 140 through the command interface of the MCD 102 and the command interface of DRAM 104. In some embodiments, the refresh command may include any of the information (e.g., row identifier, a bank identifier, and/or a rank identifier) from the payload of the RFM packet. In some embodiments, each of the memory controllers 110 may be configured to determine that other memory cells that are not identified by the information from the payload of a signal also need to be refreshed, and in response, include an identifier (e.g., row identifier, a bank identifier, and/or a rank identifier) to the other memory cells in the refresh command.

In some embodiments, the receiving of a refresh command by a control circuit 140 causes the control circuit 140 to refresh one or more memory cells of its respective set of memory banks (e.g., Banks 0a-7a or Banks 0b-7b) according to the refresh command. For example, the refresh command may indicate that all memory cells of Bank 0a needs to be refresh, such that when the control circuit 140a receives the refresh command, the control circuit 140a refreshes all the memory cells of Bank 0a. In some embodiments, the refresh command instructs when a control circuit 140 should refresh its respective set of memory banks, it is the responsibility of the control circuit 140 to self-determine which memory cells of its respective set of memory banks should be refreshed.

If a memory controller 110 determines that DRAM 104 is configured in a second mode, then the memory controller 110 may determine, based on the information received through a command interface or a data interface of the MCD 102, whether to schedule a refresh event for its respective set of memory banks (e.g., Banks 0a-7a or Banks 0b-7b) according to the second mode. If the memory controller 110 determines to schedule the refresh event for its respective memory bank according to the second mode, then the memory controller 110 may send a refresh command (sometimes referred to as, "second command") to its respective control circuit 140 through the command interface of the MCD 102 and the command interface of DRAM 104.

In some embodiments, the information received through the command interface or data interface of the MCD 102 may be a predetermined threshold value. For example, the memory controller 110 may receive a predetermined threshold value (e.g., RAA Initial Management Threshold (RAAIMT)) from the DRAM 104 through the data interface of the memory controller 110a, and determine to schedule a refresh event for the first set of memory banks (Banks 0a-7a) based on a timer that is configured with the predetermined threshold value.

In some embodiments, the information received through the command interface or data interface of the MCD 102 may correspond to an activity of one of the memory banks of the DRAM 104. For example, the memory controller 110 may monitor the first set of memory banks to determine a total count of reads and/or writes of each of the memory cells of the first set of memory banks, and send the total counts to the memory controller 110a through the command interface or data interface if any of the total counts exceeds a predetermined threshold value. The memory controller 110a may then determine, based on the total count, whether to schedule a refresh event for the first set of memory banks (Banks 0a-7a).

In some embodiments, the memory controller 110a refreshes a first group of memory cells of Banks 0a-7a according to the first mode, and refreshes a second group of memory cells of Banks 0a-7a according to the second mode. In some embodiments, the first group of memory cells and the second group of memory cells may correspond to the same memory cells. In some embodiments, the first group of memory cells and the second group of memory cells may correspond to the different (e.g., none overlapping, some overlapping) memory cells.

The scheduling of refresh events by each of the memory controllers 110 based on the first mode during a plurality of predetermined time windows reduces the data latency on the data interface of the MCD 102 and/or the DRAM 104 as compared to a scheduling of refresh events based on the second mode during the plurality of predetermined time windows. For example, when determining to schedule refresh events according to the first mode, the memory controller 110a may determine to schedule only 1 refresh event during timeslots 1-3, and therefore only send 1 refresh command to the DRAM 104 across the command interface and/or data interface. Conversely, when determining to schedule refresh events according to the second mode, the memory controller 110a may determine to schedule 3 refresh events during the same timeslots 1-3, and therefore send 3 refresh commands to the DRAM 104 across the command interface and/or data interface. As a result, the scheduling of refresh events according to the second mode causes a greater data latency on the command interface and/or the data interface, and reduces the bandwidth of the memory system 100 because normal operation of the memory system 100 is paused when refreshing the memory banks of DRAM 104.

Although the exemplary embodiment disclosed in FIG. 1 includes two sets of memory controllers 110, two sets of communication interfaces, two sets of control circuits 140, and two sets of memory banks, the same techniques can be applied to embodiments that include one memory controller 110, one set of communication interfaces, one control circuit 140, and one set of memory banks.

Figure 2:
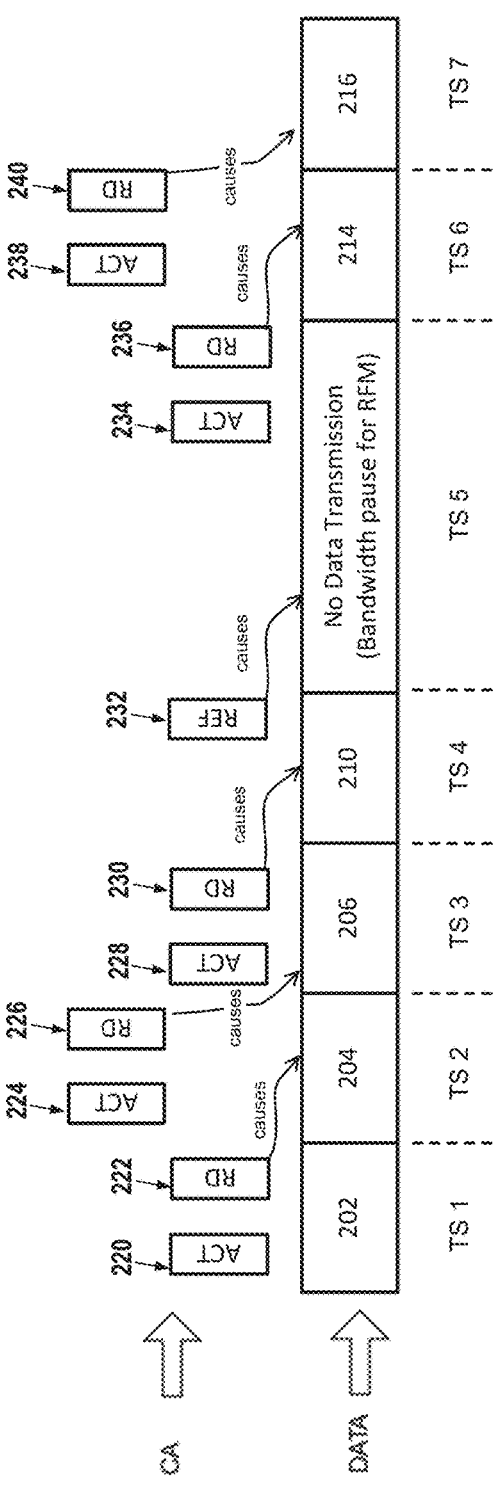
FIG. 2 illustrates a timing diagram of an example refresh management (RFM) procedure performed by component in the memory system 100 in FIG. 1, according to some embodiments.

FIG. 2 illustrates a timing diagram of an example refresh management (RFM) procedure performed by the memory system 100 in FIG. 1, according to some embodiments. The timing diagram 200 shows the commands that the MCD 102 may send to the DRAM 104 via the command interface during timeslot 1 (TS 1) to timeslot 7 (TS 7). The timing diagram 200 also shows the data that the MCD 102 may read from the first set of memory banks (Banks 0a-7a) and/or the second set of memory banks (Banks 0b-7b) via the data interface during TS 1 to TS 7 after sending commands to the DRAM 104. The timing diagram 200 will now be explained in greater detail.

During TS 1, the MCD 102 may send an activate (ACT) command 220 to the DRAM 104 to activate a row in a bank of the first set of memory banks (Banks 0a-7a) or the second set of memory banks (Banks 0b-7b), and a read (RD) command 222 to initiate a read burst to the active row. The RD command 222 causes data 204 to be sent from one or more memory cells of the active row of the DRAM 104 to the MCD 102 during TS 2.

During TS 2, the MCD 102 may send an ACT command 224 to the DRAM 104 to activate a row in a bank of the first set of memory banks (Banks 0a-7a) or the second set of memory banks (Banks 0b-7b), and a RD command 226 to initiate a read burst to the active row. The RD command 226 causes data 206 to be sent from one or more memory cells of the active row of the DRAM 104 to the MCD 102 during TS 3.

During TS 3, the MCD 102 may send an ACT command 228 to the DRAM 104 to activate a row in a bank of the first set of memory banks (Banks 0a-7a) or the second set of memory banks (Banks 0b-7b), and a RD command 230 to initiate a read burst to the active row. The RD command 230 causes data 210 to be sent from one or more memory cells of the active row of the DRAM 104 to the MCD 102 during TS 4.

During TS 4, the MCD 102 may send a refresh (REF) command 232 to the DRAM 104 to cause the DRAM 104 to perform a refresh of one or more memory cells of the first set of memory banks (Banks 0a-7a) or the second set of memory banks (Banks 0b-7b) during TS 5. During the refresh event, the transmission of data from the DRAM 104 to the MCD 102 via the data interface is paused and/or prevented from taking place. Because there is no data transmission during the refresh event, the bandwidth of the memory system 100 is reduced. Furthermore, the transmission of the REF command 232 increases the data latency and/or data congestion of the command interface.

During TS 5, the MCD 102 may send an ACT command 234 to the DRAM 104 to activate a row in a bank of the first set of memory banks (Banks 0a-7a) or the second set of memory banks (Banks 0b-7b), and a RD command 236 to initiate a read burst to the active row. The RD command 236 causes data 214 to be sent from one or more memory cells of the active row of the DRAM 104 to the MCD 102 during TS 6.

During TS 6, the MCD 102 may send an ACT command 238 to the DRAM 104 to activate a row in a bank of the first set of memory banks (Banks 0a-7a) or the second set of memory banks (Banks 0b-7b), and a RD command 240 to initiate a read burst to the active row. The RD command 240 causes data 216 to be sent from one or more memory cells of the active row of the DRAM 104 to the MCD 102 during TS 7.

Figure 3:
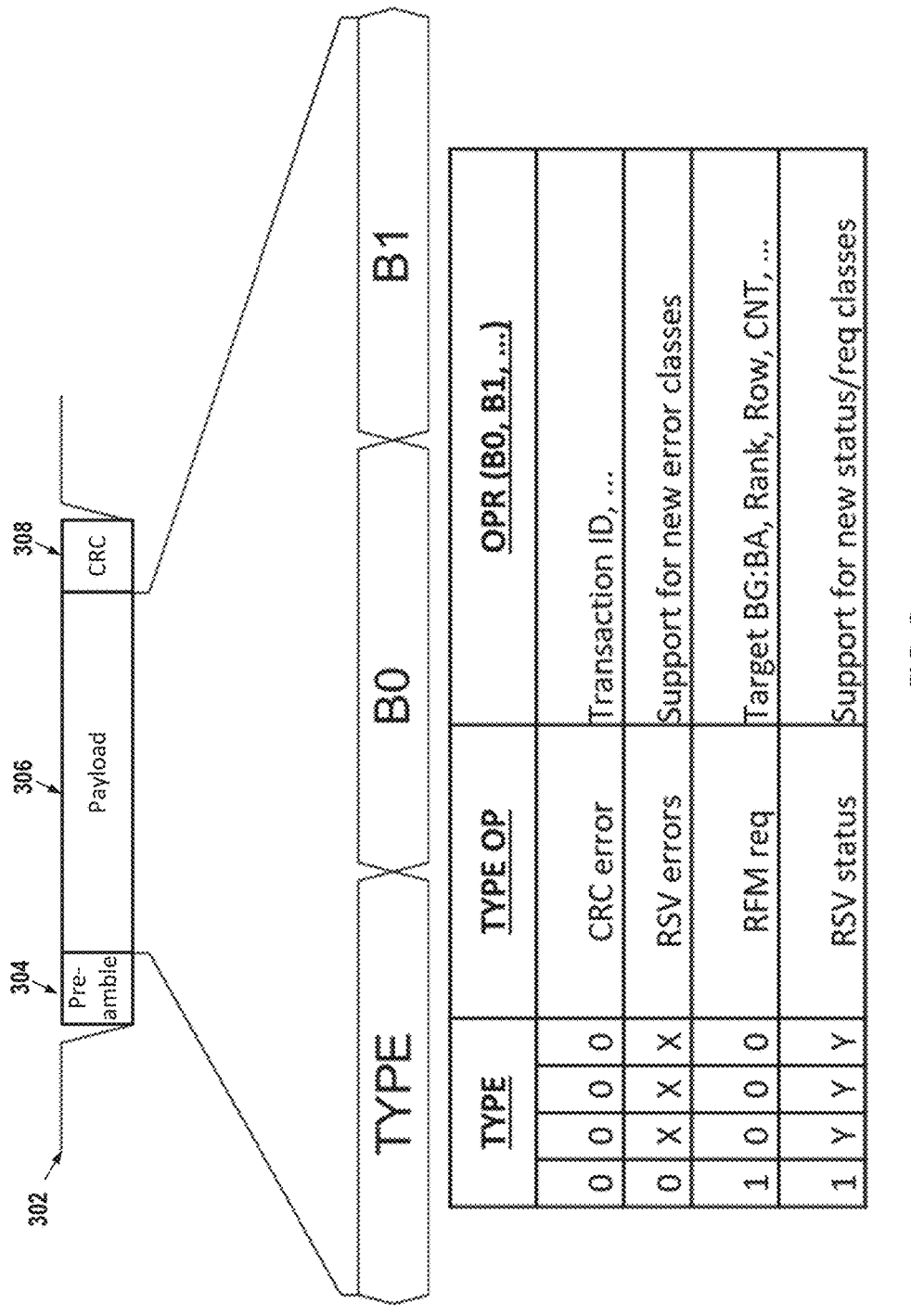
FIG. 3 illustrates a block diagram of an example refresh management packet (RFM) generated in FIG. 1, according to some embodiments.

FIG. 3 illustrates a block diagram of an example refresh management packet (RFM) generated by the memory system 100 in FIG. 1, according to some embodiments. The block diagram 300 shows a signal 302 that the DRAM 104 transmit to the MCD 102 through SBI 160 and SBI 130 in response to detecting an actual occurrence of a row hammer event on the first set of memory banks (e.g., Banks 0a-7a) or the second set of memory banks (e.g., Banks 0b-7b).

The signal 302 includes an RFM packet, where the packet includes a preamble 304, a payload 306, and a cyclic redundancy check (CRC) value 308. As shown in FIG. 3, the payload 306 includes a TYPE field and operation fields (e.g., B0, B1, . . . , Bn). The TYPE field may include a plurality of bits that indicate a TYPE OP, such as a CRC error, an RSV error, an RFM request, or an RSV status.

FIG. 4 is a flow diagram depicting a method for performing a low overhead refresh management of the dynamic random access memory device (DRAM) in FIG. 1, according to some embodiments. Method 400 may be performed by processing logic that may comprise hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. In some embodiments, method 400 may be performed by a memory system, such as memory system 100 in FIG. 1. In some embodiments, method 400 may be performed by a memory controller, such as MCD 102 in FIG. 1.

With reference to FIG. 4, method 400 illustrates example functions used by various embodiments. Although specific function blocks ("blocks") are disclosed in method 400, such blocks are examples. That is, embodiments are well suited to performing various other blocks or variations of the blocks recited in method 400. It is appreciated that the blocks in method 400 may be performed in an order different than presented, and that not all of the blocks in method 400 may be performed.

As shown in FIG. 4, the method 400 includes the block 402 of receiving, by a controller from a memory (e.g., DRAM 104) via a feedback interface, a signal indicative of an occurrence of a row hammer event. The method 400 includes the block 404 of determining, by the controller based on the signal, whether to schedule a refresh event. The method 400 includes the block 406 of sending, by the controller responsive to determining whether to schedule the refresh event, a first command to the memory to execute a refresh operation.

Unless specifically stated otherwise, terms such as "receiving," "determining," "sending," or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices. Also, the terms "first," "second," "third," "fourth," etc., as used herein are meant as labels to distinguish among different elements and may not necessarily have an ordinal meaning according to their numerical designation.

Examples described herein also relate to an apparatus for performing the operations described herein. This apparatus may be specially constructed for the required purposes, or it may comprise a general purpose computing device selectively programmed by a computer program stored in the computing device. Such a computer program may be stored in a computer-readable non-transitory storage medium.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/ component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method of controlling a dynamic random access memory (DRAM) device, the method comprising:
   receiving, by a controller from the DRAM device via a feedback interface, a signal indicative of an occurrence of a row hammer event, wherein the signal comprises a refresh management (RFM) packet comprising a cyclic redundancy check (CRC) value and a payload of at least one of a row identifier, a bank identifier, or a rank identifier;
   determining, by the controller based on the signal, whether to schedule a refresh event;
   sending, by the controller responsive to determining whether to schedule the refresh event, a first command to the DRAM device, to execute a refresh operation;
   determining, by the controller, an error associated with the RFM packet based on the CRC value; and
   sending, by the controller to the DRAM device, a request for the DRAM device to resend the payload of the RFM packet, wherein the request causes the DRAM device to resend the payload of the RFM packet to the controller in a second RFM packet via the feedback interface.

2. The method of claim 1, wherein the signal is asynchronous to at least one of a data interface of the DRAM device or a command interface of the DRAM device.

3. The method of claim 1, wherein the controller receives the signal from the DRAM device without previously sending a request to the DRAM device for the signal.

4. The method of claim 1, wherein determining, by the controller, whether to schedule the refresh event comprises:
   determining whether to schedule the refresh event without monitoring at least one of an activity of the DRAM device or a timer associated with a predetermined threshold value of the DRAM device.

5. The method of claim 1, wherein the payload of the RFM packet comprises information indicative of at least one of a communication error associated with the DRAM device.

6. The method of claim 1, further comprising:
   determining, by the controller based on mode information, whether to refresh the DRAM device based on a first mode or a second mode, and either:
   determining, by the controller based on the signal, to schedule the refresh event responsive to determining to refresh the DRAM device based on the first mode, or
   determining, by the controller based on information received via a data interface of the DRAM device, to schedule a second refresh event responsive to determining to refresh the DRAM device based on the second mode, and
   sending, by the controller responsive to determining to schedule the second refresh event, a second command to the DRAM device to cause the memory DRAM device to perform a second refresh of the DRAM device.

7. The method of claim 6, further comprising:
retrieving, by the controller, the mode information from a register of the DRAM device.

8. The method of claim 6, wherein a scheduling of refresh events based on the first mode during a plurality of predetermined time windows reduces a data latency on the data interface of the DRAM device as compared to a scheduling of refresh events based on the second mode during the plurality of predetermined time windows.

9. The method of claim 1, wherein the feedback interface corresponds to a single output pin of the DRAM device.

10. A controller integrated circuit (IC) device, comprising:
a command interface to be coupled to a memory device;
a data interface to be coupled to the memory device;
a feedback interface to be coupled to the memory device;
a controller circuit coupled to the command interface and the feedback interface, the controller circuit to:
receive, from the memory device via the feedback interface, a signal indicative of an occurrence of a row hammer event, wherein the signal comprises a refresh management (RFM) packet comprising a cyclic redundancy check (CRC) value and a payload of at least one of a row identifier, a bank identifier, or a rank identifier;
determine a refresh event based on the signal;
send, via the command interface responsive to determining to schedule the refresh event, a first command to the memory device to cause the memory device to perform a refresh operation;
determine an error associated with the RFM packet based on the CRC value; and
send, to the DRAM device, a request for the DRAM device to resend the payload of the RFM packet, wherein the request causes the DRAM device to resend the payload of the RFM packet to the controller circuit in a second RFM packet via the feedback interface.

11. The controller IC device of claim 10, wherein the signal is asynchronous to the command interface of the memory device, and the controller circuit is further to:
receive the signal from the memory device without previously sending a request to the memory device for the signal.

12. The controller IC device of claim 10, wherein the controller circuit is further to:
determine to schedule the refresh event without monitoring at least one of an activity of the memory device or a timer associated with a predetermined threshold value of the memory device.

13. The controller IC device of claim 10, wherein the feedback interface corresponds to a single output pin of the memory device.

14. The controller IC device of claim 10, wherein the payload of the RFM packet comprises information indicative of a communication error associated with the memory device.

15. The controller IC device of claim 10, wherein the controller circuit is further to:
determine, based on mode information, whether to refresh the memory device based on a first mode or a second mode, and either:
determine, responsive to determining to refresh the memory device based on the first mode, to schedule the refresh event based on the signal, or
determine, responsive to determining to refresh the memory device based on the second mode, to schedule a second refresh event based on information received via the data interface of the memory device, and
send, responsive to determining to schedule the second refresh event, a second command to the memory device to cause the memory device to perform a second refresh of the memory device.

16. The controller IC device of claim 15, wherein a scheduling of refresh events based on the first mode during a plurality of predetermined time windows reduces a data latency on the data interface of the memory device as compared to a scheduling of refresh events based on the second mode during the plurality of predetermined time windows.

17. A dynamic random access memory (DRAM) device, comprising:
an array of memory cells;
a command interface to receive commands from a controller integrated circuit (IC) device;
a feedback interface to send, to the controller IC device, a signal indicative of an occurrence of a row hammer event, wherein the signal comprises a refresh management (RFM) packet comprising a cyclic redundancy check (CRC) value and a payload of at least one of a row identifier, a bank identifier, or a rank identifier; and
a control circuit coupled to the array of memory cells, the command interface, and the feedback interface, the control circuit to;
detect the occurrence of the row hammer event;
receive, from the controller IC device, a request for the DRAM device to resend the payload of the RFM packet; and
resend the payload of the RFM packet to the controller circuit in a second RFM packet via the feedback interface responsive to receiving the request.

\* \* \* \* \*